United States Patent [19]

Neuhaus et al.

[11] 4,393,432

[45] Jul. 12, 1983

[54] SAFETY DEVICE FOR A CONDUCTING PATH IN A LOAD DEVICE

[75] Inventors: Dieter Neuhaus, Sulzbach; Gerhard Söhner, Remshalden; Walter Ruf, Korntal-Münchingen; Erich Jesse, Marbach; Helmut Roth, Stuttgart, all of Fed. Rep. of Germany

[73] Assignee: Robert Bosch GmbH, Stuttgart, Fed. Rep. of Germany

[21] Appl. No.: 123,150

[22] Filed: Feb. 21, 1980

Related U.S. Application Data

[63] Continuation of Ser. No. 872,139, Jan. 25, 1978, abandoned.

[30] Foreign Application Priority Data

Jan. 27, 1977 [DE] Fed. Rep. of Germany ....... 2703255
Oct. 27, 1977 [DE] Fed. Rep. of Germany ....... 2748267

[51] Int. Cl.³ .......................... H02H 3/00; H02H 7/20
[52] U.S. Cl. ......................................... 361/104; 361/88; 357/51; 357/47; 307/127; 307/303; 307/326; 320/25; 320/26; 337/4; 337/297

[58] Field of Search ............... 361/104, 77, 88, 42, 361/49, 50, 84, 411; 320/25, 26, 39; 307/10 BP, 200 A, 127, 303, 326; 340/636, 635, 660, 661; 357/51, 47; 337/4, 297, 296

[56] References Cited

U.S. PATENT DOCUMENTS

| | | | |
|---|---|---|---|
| 3,313,995 | 4/1967 | Bach et al. | 361/104 X |
| 3,371,330 | 2/1968 | Howard et al. | 320/25 X |
| 3,564,354 | 2/1971 | Aoki et al. | 357/51 |
| 3,619,725 | 11/1971 | Soden et al. | 357/51 X |
| 3,766,435 | 10/1973 | Childers | 361/42 |
| 3,829,709 | 8/1974 | Maigret et al. | 357/51 X |
| 3,904,785 | 2/1976 | Genesi | 361/77 X |
| 4,042,950 | 8/1977 | Price | 357/51 |
| 4,138,705 | 2/1979 | Doll | 361/104 |

*Primary Examiner*—Patrick R. Salce
*Attorney, Agent, or Firm*—Edwin E. Greigg

[57] ABSTRACT

A safety device is included in a circuit comprising a power source and a user device. The power source has one terminal connected to ground, as does the user device, with the safety device connected in a conducting path leading to the ground in the user device. In the event of an incorrect polarity connection between the power source and user device, a current path through the safety device and to ground is established.

8 Claims, 2 Drawing Figures

SAFETY DEVICE FOR A CONDUCTING PATH IN A LOAD DEVICE

This is a continuation of application Ser. No. 872,139, filed Jan. 25, 1978, and now abandoned.

BACKGROUND OF THE INVENTION

This invention relates to a safety device for a current conduting path in a current using or user device that lies between a terminal connection and a ground connection of the user device.

In user devices with a connection between the terminal connection and the ground connection there exists a danger of melting the connecting line when the wrong polarity is used in connecting the user device to the current supply connections. This danger can indeed be avoided by means of at least one diode. However, such an arrangement is not always practical in the necessary location.

A safety device is therefore desirable for cases where the current supply device has a ground connection and this ground connection is connected with one of the terminal connections. In such a case, when the wrong polarization of the current supply acts on the safety device, lying outside of the useful current path, the safety device interrupts a short-circuit current. The actual load element in the user device is protected by a diode behind the terminal connection that is not connected with the ground connection.

The present invention proceeds from a safety device for use in a user device with two terminal connections and a ground connection, according to which the terminal connection, that during normal polarization conducts the same potential as the ground connection, has a diode, as the safety device, placed behind it in the circuit. The actual load element in the user device lies between the further terminal and the connection point of the diode and the ground connection.

The disadvantage of this arrangement is that, during normal operations, a potential difference occurs between the terminal connection, behind which the diode is located, and the ground connection.

OBJECT AND SUMMARY OF THE INVENTION

It is, therefore, a principle object of this invention to provide a safety device for the conducting path in a user device which protects the conducting path of the user device against incorrect polarization with a current supply device.

This object, as well as others which will become apparent from the following, are achieved by the provision of a safety device situated in a user device between a ground connection and one of two terminal connections of the user device. Within this user device there is also situated a load element which is connected to the safety device and to the other terminal connection of the user device. With this safety device, a diode designed as a protection for the actual load element can be located behind the terminal connection, which during normal operations is subject to operating potential, and no potential difference appears between the other terminal connection and the ground connection.

By connecting the ground connection to the user device housing, an advantageous further development of the safety device is possible. The advantage is that the ground connection of the user device remains connected with the user device housing and a protecting effect against outside influences continues to exist, even when the safety device has been activated and the interruption between the ground connection and the corresponding terminal connection continues.

A further improvement is realized by incorporating the safety device in a printed circuit board. By means of this incorporation, it is assured that the safety device for the conductor path section for each printed circuit board can be separately produced, for instance where user devices are arranged on one or more printed circuit boards.

The novelty in the embodiment, especially in a safety device incorporated in the printed circuit board, is that the safety device itself is formed as part of the printed circuit board with a decreased cross section. In this manner a structurally simple preset melting point in the printed circuit board is produced, and thereby a safety precaution against a random melting of some other section of the printed circuit board achieved. By means of the fact that this preset melting point is arranged outside of the actual useful current path, there is no negative influence on the operation of the user device, after the polarization has been corrected.

The same result is achieved for thick layer and thin layer boards.

The invention can be used in connection with any current supply devices, that is, independent of whether line or battery operation is used.

DESCRIPTION OF THE PREFERRED EMBODIMENT

Figure 1:
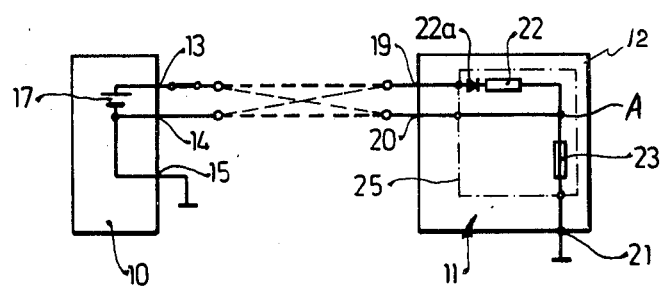
FIG. 1 schematically illustrates a safety device for the conducting path of a user device supplied with current from a power source.

In FIG. 1 a current supply device 10 and a current using or user device 11 are shown. The current supply device 10 has a battery 17 as a source of current and three connections 13, 14 and 15, of which two form terminal connections 13 and 14, and 15 represents a ground connection. In the current supply device itself the connections 14 and 15 are connected with each other.

The user device 11 also has three connections 19 through 21. A series circuit consisting of a current using or load element 22 and a diode 22a lies between the terminal connections 19 and 20, and the terminal connection 20 is coupled with the ground connection 21 by means of a safety device or fuse 23. In addition, the ground connection 21 is electrically connected with the user device housing 12. A printed circuit board 25 in the user device housing 12 contains the load element 22, the diode 22a and the safety fuse 23. The possible connections between the terminal connections 13 and 14 of the current supply device 10 and those of the user device are shown by broken lines.

The parallel course of the two broken lines shows the correct polarization, in which the load element 22 lies parallel to the current source 17. In this operating condition the diode 22a lying in series with the load element 22 is supplied with current, and the safety fuse 23 is not. The user device housing 12 is directly connected with the ground connection 15 of the current supply device 10, and is also connected with the terminal connection 14 by means of the safety fuse 23.

If the user device 11 is incorrectly polarized, the current connections between the current supply device 10 and the user device 11 are connected as shown by the crossing, broken lines. The result is a short circuit of the current source 17 of the current supply device 10 with a current flow from the terminal connection 13, through the terminal connection 20, to the safety fuse 23, and to the ground connections 21 and 15. The short circuit current allows the safety fuse 23 to be acted upon, whereby the short circuit flow is interrupted. The diode 22a protects the load element 22 from destruction caused by incorrect polarization.

After the polarization has been corrected the load element 22 can again operate correctly. The safety fuse 23 is in fact broken, nevertheless, protection for the user device is retained by means of the user device housing 12 and its connection to the ground connection 21.

It is recommended, when user devices are arranged on printed circuit boards, to provide a separate safety fuse for each printed circuit board, by means of which, protection for the conducting paths is guaranteed for each printed circuit board.

Figure 2:
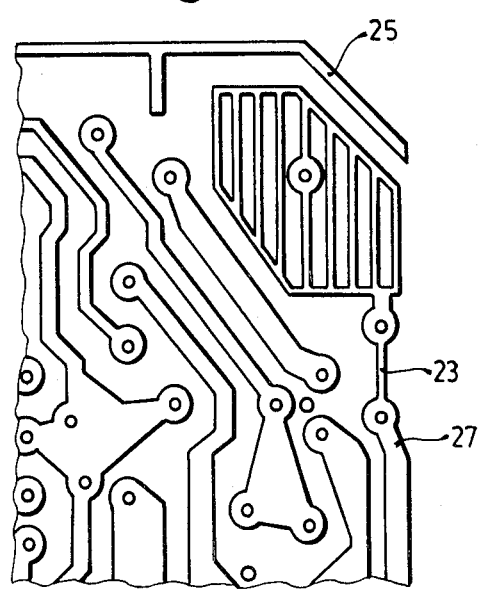
FIG. 2 illustrates a portion of a printed circuit board with a suggested safety device according to one aspect of the invention.

An examplary embodiment of a safety fuse on a printed circuit board is shown in FIG. 2. The safety fuse 23 is formed as a section of the conducting path 27 having a smaller cross section. What is shown is a terminal region designated 23 in the conducting path 27, which serves as the safety fuse. As a further exemplary embodiment, a thinning of the conducting path, while the width remains the same, is possible, but such an arrangement is connected with higher costs in the production or printed circuit boards.

The safety fuse shown in FIG. 2 is suitable not only as protection against a random destruction of the conducting path when the wrong polarization is applied, but also generally as a preset melting point for any kind of overload of printed circuit boards.

What is claimed is:

1. In combination with a user device and a current supply device, each device having at least two terminal connections and a ground connection, one of the terminal connections of the current supply device being connected to its ground connection, one of the terminal connections of the user device being connected to its ground connection, the other terminal connection of the user device being connected to a load element in the user device, a diode means in series with said load element between said other terminal of said user device and said load element; said load element also being connected to the ground connected terminal connection, of the user device said two terminal connections of both devices being engageable to produce a current flow, and a safety device within the user device connected between the ground connected terminal connection of the user device and the ground connection of the user device whereby during correct polarization of said user device, no current flows through said safety device, and during incorrect polarization of said user device said safety device operates to isolate said user device ground connection from said ground connected terminal connection.

2. The combination as defined in claim 1, wherein the user device includes a housing to which the user device ground connection is connected.

3. The combination as defined in claim 1, wherein the safety device is formed as part of a printed circuit board including a conducting path.

4. The combination as defined in claim 3, wherein the safety device is formed as a decreased cross section of the conducting path.

5. The combination as defined in claim 3, wherein the safety device is formed as a decreased cross sectional portion of the conducting path of a thick layer circuit.

6. The combination as define in claim 3, wherein the safety device is formed as a decreased cross sectional portion of the conducting path of a thin layer circuit.

7. The combination as defined in claim 1, wherein the user device includes a thick layer circuit board, and wherein the safety device is formed as part of the thick layer circuit board.

8. The combination as defined in claim 1, wherein the user device includes a thin layer circuit board, and wherein the safety device is formed as part of the thin layer circuit board.

* * * * *